United States Patent
Trublowski et al.

[19]

[11] Patent Number: 5,917,704

[45] Date of Patent: Jun. 29, 1999

[54] LASER-SOLDERABLE ELECTRONIC COMPONENT

[75] Inventors: John Trublowski, Troy; Andrew Z. Glovatsky, Livonia; Richard Keith McMillan, II, Dearborn; Bernard Allen Meyer, Taylor, all of Mich.

[73] Assignee: Ford Motor Company, Dearborn, Mich.

[21] Appl. No.: 08/944,700

[22] Filed: Oct. 6, 1997

[51] Int. Cl.[6] ...................................... H05K 7/20
[52] U.S. Cl. .................... 361/705; 361/704; 257/707; 257/693; 257/712; 257/796; 174/52.4; 165/80.2
[58] Field of Search ..................... 361/667, 683, 361/687, 690–697, 700–721; 174/16.3, 52.2, 52.4; 165/80.3, 46, 80.4, 165; 257/666, 686, 678, 703, 773, 706, 723, 705, 691, 667, 675, 693, 700–718, 787, 796; 156/245

[56] References Cited

U.S. PATENT DOCUMENTS

| | | | |
|---|---|---|---|
| 4,531,044 | 7/1985 | Chang | 219/121 LM |
| 4,760,948 | 8/1988 | Spiecker . | |
| 4,926,022 | 5/1990 | Freedman | 219/121.63 |
| 4,994,897 | 2/1991 | Golubic et al. | 357/81 |
| 5,221,038 | 6/1993 | Melton et al. . | |
| 5,229,916 | 7/1993 | Frankeny et al. . | |
| 5,444,025 | 8/1995 | Sono et al. | 437/207 |
| 5,495,089 | 2/1996 | Freedman et al. . | |
| 5,504,652 | 4/1996 | Foster et al. . | |
| 5,532,517 | 7/1996 | Kawamoto | 257/773 |
| 5,598,321 | 1/1997 | Mostafazadeh et al. . | |

*Primary Examiner*—Leo P. Picard
*Assistant Examiner*—Michael Datskovsky
*Attorney, Agent, or Firm*—Leslie C. Hodges

[57] ABSTRACT

There is disclosed herein an electronic component 10 having an integral heat spreader 16 specially designed to assist in laser soldering of the heat spreader to a solder pad 22 on a substrate 20. The component 10 has a top surface 30, a bottom surface 32 generally parallel to the top surface, and at least one perimeter outer surface 34 generally orthogonal to and between the top and bottom surfaces. The component 10 comprises: a circuit portion 12; at least one termination 14 connected to the circuit portion 12 and extending outward therefrom; a heat spreader 16 portion situated generally beneath and in thermal contact with the circuit portion 12; and a body portion 18 enclosing at least a top surface of the circuit portion 12 and a part of each termination 14 proximate the circuit portion 12. The heat spreader 16 defines at least part of the bottom surface 32 of the electronic component 10 and at least part of the at least one perimeter outer surface 34 of the electronic component 10.

14 Claims, 2 Drawing Sheets

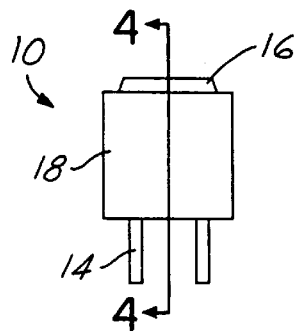 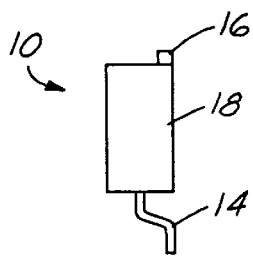 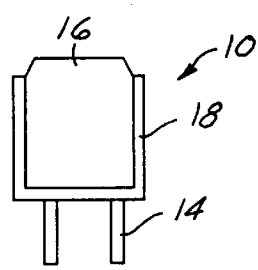
FIG. 1  FIG. 2  FIG. 3
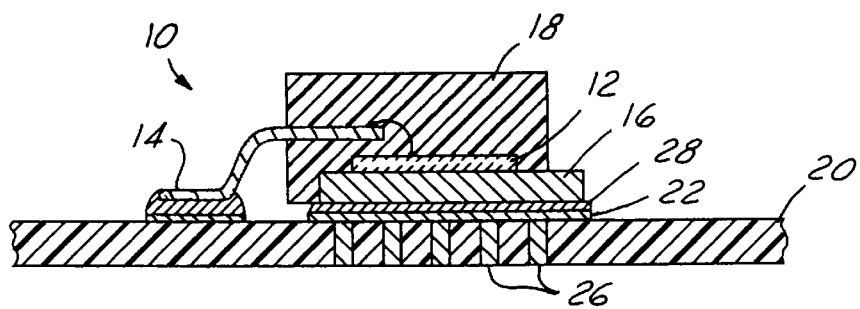
FIG. 4
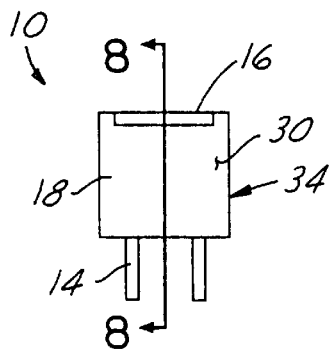 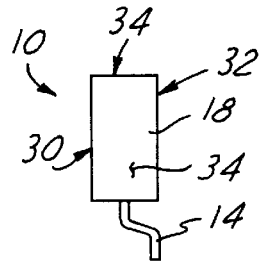 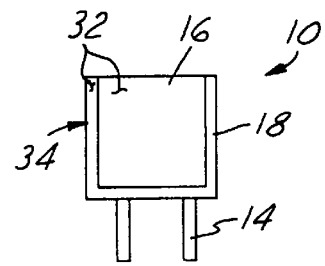
FIG. 5  FIG. 6  FIG. 7
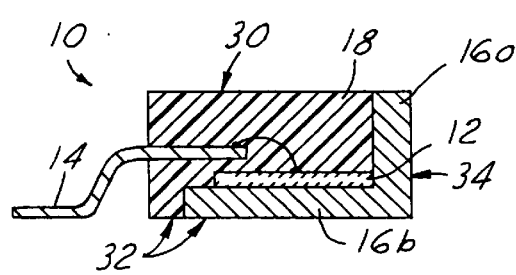 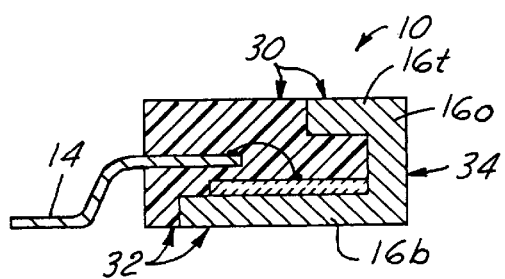
FIG. 8  FIG. 9

LASER-SOLDERABLE ELECTRONIC COMPONENT

BACKGROUND OF THE INVENTION

1. Field of the Invention

The present invention relates generally to electronic components. More particularly, the present invention relates to electronic components having an integral heat spreader.

2. Disclosure Information

Many types of electronic components produce excessive amounts of heat during operation which, if not transferred away from the component, might damage the component or retard its performance. One way of transferring heat away from such components is to attach an external heat sink to the component. This type of external heat sink might consist of a finned copper or aluminum block thermally attached to the top of the component. Another way of transferring excess heat away is to incorporate a heat sink into the component itself when it is manufactured; this type of integral heat sink is often referred to as a "heat spreader". FIGS. 1–4 illustrate this type of approach, wherein an integrated circuit (IC) 12 and its associated leadframe terminations 14 have been thermally attached to a heat spreader 16, over which an electrically non-conducting body 18 has been molded. The component 10 is attached to the substrate 20 by soldering the terminations 14 and heat spreader 16 to their respective solder pads 22. With this type of arrangement, heat from the IC 12 can be transferred by the integral heat spreader 16 to its associated solder pad 22. Heat may be further transferred away by a circuit trace to which the solder pad 22 is connected, and/or by thermal vias/heat pipes 26 disposed beneath and in thermal contact with the solder pad 22.

The type of component shown in FIGS. 1–4 is typically connected to a substrate by a process of (1) placing solder paste on the solder pads, (2) situating the component on the substrate such that its terminations and heat spreader rest atop their respective solder pads, thus forming an assembly, and (3) running the assembly through a conventional reflow oven which melts, reflows, and solidifies the solder paste so that solder joints form connecting the terminations and heat spreader to their associated solder pads. An alternative to using a reflow oven in step (3) above is to use laser soldering instead. In laser soldering, a beam of laser energy is directed at a solder deposition and/or a solder pad and/or a termination/heat spreader for an amount of time sufficient to transfer enough heat to the solder to melt it. The beam is then turned off or directed elsewhere, thus allowing the melted solder to solidify and form a solder joint connecting the termination/heat spreader with its solder pad.

Laser soldering works well for soldering terminations to their respective solder pads. However, it is difficult to direct a laser beam at a component's heat spreader if the spreader is situated completely underneath the component, or to transfer enough energy to the heat spreader if only a small portion of it protrudes out from underneath the component.

It would be desirable, therefore, to provide an electronic component which includes an integral heat spreader that is also capable of being easily laser soldered.

SUMMARY OF THE INVENTION

The present invention overcomes the disadvantages of the prior art by providing an electronic component having an integral heat spreader designed to facilitate laser soldering of the heat spreader to a solder pad on a substrate. The component has a top surface, a bottom surface generally parallel to the top surface, and at least one perimeter outer surface generally orthogonal to and between the top and bottom surfaces. The component comprises: a circuit portion; at least one termination connected to the circuit portion and extending outward therefrom; a heat spreader situated generally beneath and in thermal contact with the circuit portion; and a body is portion enclosing at least a top surface of the circuit portion and a part of each termination proximate the circuit portion. The heat spreader defines at least part of the bottom surface of the electronic component and at least part of the at least one perimeter outer surface of the electronic component.

It is an advantage that an integral heat spreader of a component according to the present invention may be laser soldered to its corresponding substrate solder pad more easily than is the case with conventional components.

It is a further advantage that an integral heat spreader of a component according to the present invention may be soldered to its corresponding solder pad using either laser soldering or a conventional reflow process.

These and other advantages, features and objects of the invention will become apparent from the drawings, detailed description and claims which follow.

BRIEF DESCRIPTION OF THE DRAWINGS

FIGS. 1–3 are top, side, and bottom views, respectively, of an electronic component having an integral heat sink according to the prior art.

FIG. 4 is a sectional view of the component shown in FIG. 1 taken along line 4—4.

FIGS. 5–7 are top, side, and bottom views, respectively, of a first embodiment of an electronic component having an integral heat sink according to the present invention.

FIG. 8 is a sectional view of the component shown in FIG. 5 taken along line 8—8.

FIG. 9 is a sectional view of a second embodiment of an electronic component according to the present invention.

DETAILED DESCRIPTION OF THE PREFERRED EMBODIMENTS

Figure 10:
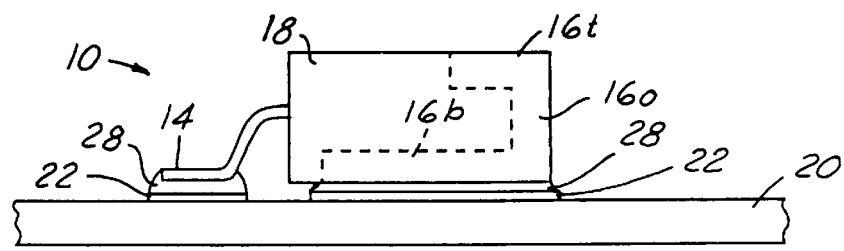
FIG. 10 is a side view of a laser-solderable electronic assembly according to the present invention.

Referring now to the drawings, FIGS. 5–7 show a laser-solderable electronic component 10 having an integral heat spreader 16 according to the present invention. The component 10 has a top surface 30, a bottom surface 32 generally parallel to the top surface, and at least one perimeter outer surface 34 generally orthogonal to and between the top and bottom surfaces 30/32. There may be only one perimeter outer surface 34 as in the case of a component having a generally round (e.g., circular or ovoid) shape, three surfaces 34 in the case of a generally triangular-shaped component, four surfaces 34 as in the generally rectangular-shaped component illustrated by FIGS. 5–8, and so forth.

As further illustrated in FIG. 8, the component comprises: a circuit portion 12 (e.g., an integrated circuit), at least one termination 14 connected to the circuit portion 12 and extending outward therefrom; a heat spreader 16 situated generally beneath and in thermal contact with the circuit portion 12; and a body portion 18 enclosing at least a top surface of the circuit portion 12 and a part of each termination proximate the circuit portion. The heat spreader 16 is configured and arranged within the component 10 such that it defines at least part of the bottom surface 32 of the component 10 and at least part of the perimeter outer surface(s) 34. The heat spreader 16 may further define at least part of the top surface 30 of the component 10, as illustrated in FIG. 9.

With the heat spreader 16 defining at least part of the bottom surface 32 of the component as illustrated in FIGS. 5–9, the bottom surface 32 of a component 10 according to the present invention is similar in appearance to the bottom surface of a conventional component/heat spreader (e.g., as shown in FIG. 2). This bottom surface portion 16b of the heat spreader 16 is the part that is soldered to the corresponding solder pad 22. However, unlike conventional components with integral heat spreaders, the heat spreader 16 of the present invention is shaped and arranged such that it defines at least part of the perimeter outer surface(s) 34, and optionally part of the top surface 30 as well. These outer surface and top surface portions 16o/16t of the heat spreader 16 are unique to the present invention and provide heat spreader surfaces which are more easily accessible to a laser beam than is the case with conventional heat spreaders.

The component 10 described above may be positioned on a substrate 20 with the component's heat spreader 16 and termination(s) 14 atop their corresponding solder-pasted solder pads 22, thus forming a laser-solderable assembly. A laser may then be directed at the outer surface portion 16o and/or top surface portion 16t of the heat spreader 16, thereby causing the entire heat spreader 16—including the bottom portion 16b—to heat up enough to melt the adjacent solder paste. The laser beam may then be turned or directed elsewhere, and the molten solder paste may solidify to form a solder joint 28 connecting the heat spreader 16 to its respective solder pad 22, as shown in FIG. 10.

Figure 11:
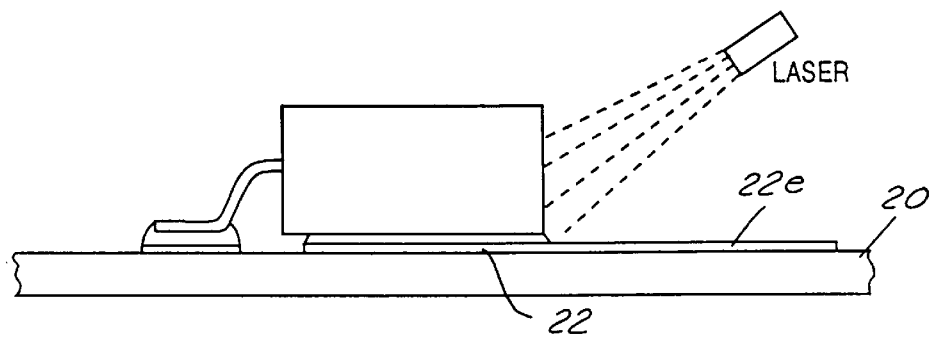
FIG. 11 is a side view of a component having an oversized heat spreader solder pad with a laser beam directed thereon proximate to the component.
Figure 12:
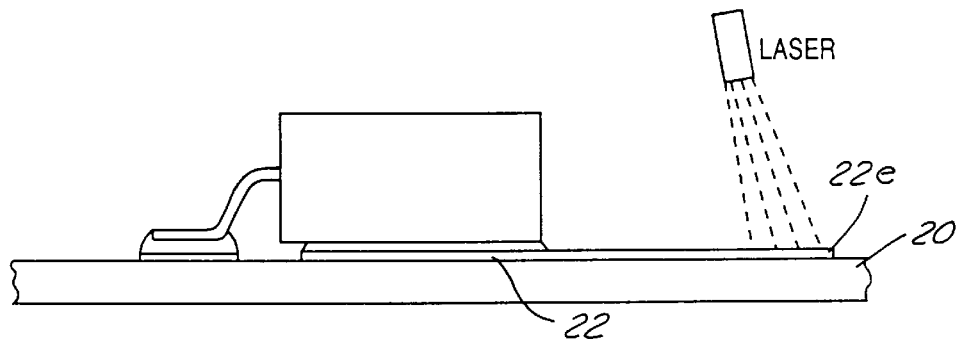
FIG. 12 is a side view of a component having an oversized heat spreader solder pad with a laser beam directed thereon distal from the component.

To further assist in transferring heat to the solder paste on the heat spreader solder pad 22, the solder pad 22 itself may be specially configured so as to present more solder pad surface area to the laser beam. This can generally be done by making the overall size of the solder ad 22 larger than is usually the case for conventional components with heat spreaders (whose heat spreader solder pads are typically about the same size and shape as the heat spreader), and extending the pad 22 outward beyond at least one bottom edge of the component. However, simply making the solder pad larger without limit does not necessarily aid in transferring additional laser-produced heat to the solder paste; in fact, making the solder pad exceptionally large would most likely have the opposite effect, in that much of the heat would be wicked away from the solder by the excess additional solder pad area 22e as shown in FIG. 11, or would be dissipated into the excess additional solder pad area 22e and the substrate 20 as shown in FIG. 12, without enough heat reaching the solder paste in either case. (There would also be a practical limit on how much any heat spreader solder pad could be enlarged, due to the proximity and board real estate needs of adjacent components and circuit traces.) To determine the amount of additional solder pad area needed, various methods of heat transfer analysis can be used which are well known to those skilled in the art to which the present invention pertains.

A variety of factors may influence the optimum amount of additional heat spreader solder pad area to provide, as well as the geometric shape and arrangement of this added area. First, the time-versus-temperature profile which the solder paste requires will be a factor. This profile will in turn be determined by such factors as: the solder paste type; the substrate material; the temperature to which the solder paste, substrate, and heat spreader may already be elevated prior to laser soldering (e.g., ambient, or at some higher preheated temperature); the size, arrangement, and thermal properties of the solder pads and the heat spreader; and so forth. Second, how much of the laser beam spot is to be directed at the heat spreader versus at the adjacent solder pad is a factor. For example, 70% of the spot might be directed onto the heat spreader and 30% onto the adjacent solder pad. Third, the power density of the laser itself may be a factor. Fourth, where the terminations are located on the component may determine on which sides of the component the solder pad might or might not extend past the bottom edges of the component. Fifth, the size and shape of the laser beam spot may be a factor. For example, if the spot is oval (e.g., due to the optics used in the laser system), then the shape of the solder pad extensions 22e might also be made oval, in order to enable the spot to be more precisely focused onto the extension 22e and to avoid wastefully directing laser energy onto the surrounding substrate. Other factors not specifically mentioned herein may also influence the enlarged solder pad size and shape.

Figures 13, 14:
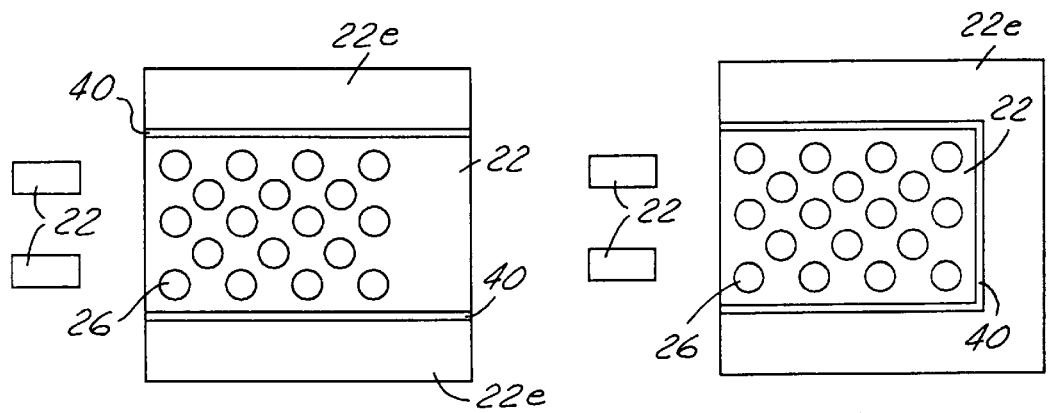
FIG. 13 is a plan view of an enlarged heat spreader solder pad having longitudinal solder masks thereon according to the present invention.
FIG. 14 is a plan view of an enlarged heat spreader solder pad having a rectangular C-shaped solder mask thereon according to the present invention.

One consequence of enlarging the heat spreader solder pad 22 is that the component may have a tendency to skew during solder reflow if the component is not somehow constrained. One way of constraining the component to avoid skew is to adhere the component to the substrate prior to reflow, such as by placing adhesive between the non-solder pad substrate surface and a corresponding non-heat spreader portion of the bottom surface of the component. Another approach for skew avoidance is to place a strip of solder mask 40 on the enlarged solder pad 22 adjacent and substantially parallel to where each lateral bottom edge of the component would lie on the pad and running across the entire length or width of the pad 22, thus forming an extension 22e on either side of where the component would lie, as shown in FIG. 13. (As used herein, "lateral" edges are those opposing edges of a substantially rectangular-shaped component on which no terminations are presented.) Alternatively, the solder mask strips 40 may be placed on the pad 22 adjacent to where each non-termination-presenting bottom edge of the component would lie (i.e., any bottom edge other than one adjacent to the component termination (s)). This is illustrated in FIG. 14, where the solder mask 40 has been placed on the pad 22 in a rectangular "C" shape, thus creating a rectangular C-shaped extension region 22e about the region where the component would lie. With either of these two solder mask approaches, solder paste would not be deposited on the solder pad extensions 22e that are separated from the major portion of the pad 22 by the solder mask 40 (e.g., the two parallel strips 22e in FIG. 13, and the rectangular C-shaped extension 22e in FIG. 14). Also, if thermal vias or heat pipes 26 are to be used underneath the heat spreader solder pad 22, they should be limited to that region of the pad 22 directly under the component, and not placed under the pad extension regions 22e. Otherwise, if thermal vias/heat pipes were placed under the extensions 22e, much of the laser-generated heat would flow directly down the vias/heat pipes and not toward the region of the pad on which solder paste has been deposited.

One skilled in the art to which the present invention pertains will recognize that each termination 14 may assume a gull-wing, J-lead, or other appropriate shape, and that the body portion 18 must be made of an electrically non-conducting material, such as plastic or ceramic. Also, the heat spreader 16 must be made of a material having a relatively high thermal conductivity k, such as aluminum, copper, or alloys thereof. The energy absorption of the heat spreader 16 may be further enhanced by providing the spreader 16 with a dark-colored outer surface, preferably black. This can be accomplished by such methods as painting, powder coating, plating, anodizing, and any other method for creating a dark surface on at least those outer surfaces of the heat spreader 16 that may be exposed to the laser (e.g., the outer surface of the heat spreader portion 16o defining at least part of the perimeter outer surface 34 in FIGS. 8 and 9, and/or the outer surface of the portion 16t defining at least part of the top surface 30 in FIG. 9).

Various other modifications to the present invention will, no doubt, occur to those skilled in the art to which the present invention pertains. For example, although the drawings show the outer surface portion 16o and top portion 16t of the heat spreader 16 as being substantially flush with the adjacent outer surfaces of the body portion 18, it is well within the scope of the present invention that one or more of these portions 16o/16t might extend outward from the immediately adjacent outer surfaces of the body portion 18. Also, although the drawings and the descriptions above refer to a rectangular-shaped component by way of example, it should be noted that the present invention may be embodied in other shapes of components (e.g., round, triangular, etc.) as well. Furthermore, although the present invention is referred to herein as a "laser-solderable" electronic component, it should be apparent that other means of soldering besides laser soldering may be used advantageously, such as focused infrared soldering, hot gas soldering, conventional reflow soldering, and so forth. It is the following claims, including all equivalents, which define the scope of the present invention.

What is claimed is:

1. A laser-solderable electronic component having a top surface, a bottom surface generally parallel to said top surface, and at least one perimeter outer surface generally orthogonal to and between said top and bottom surfaces, comprising:

an integrated circuit die;
   at least one termination wirebonded to a top surface of said die and extending outward therefrom;
   a heat spreader situated generally beneath and in thermal contact with said die; and
   an electrically insulative body portion enclosing at least a top surface of said die and a part of each termination proximate said die;
   wherein said heat spreader defines at least part of the bottom surface of said electronic component and at least part of the at least one perimeter outer surface of said electronic component.

2. An electronic component according to claim 1, wherein at least an outer surface of said heat spreader is black.

3. An electronic component according to claim 1, wherein said heat spreader further defines at least part of the top surface of said electronic component.

4. An electronic component according to claim 1, wherein said heat spreader is composed of copper or aluminum.

5. A laser-solderable electronic component having a top surface, a bottom surface generally parallel to said top surface, and at least one perimeter outer surface generally orthogonal to and between said top and bottom surfaces, comprising:

an integrated circuit die;
   at least one termination wirebonded to a top surface of said die and extending outward therefrom;
   a heat spreader situated generally beneath and in thermal contact with said die; and
   an electrically insulative body portion enclosing at least a top surface of said die and a part of each termination proximate said die;
   wherein said heat spreader defines at least part of the bottom surface of said electronic component, at least part of the top surface of said electronic component, and at least part of the at least one perimeter outer surface of said electronic component.

6. An electronic component according to claim 5, wherein at least an outer surface of said heat spreader is black.

7. An electronic component according to claim 5, wherein said heat spreader is composed of copper or aluminum.

8. A laser-solderable electronic assembly, comprising:

(a) a substrate having a solder pad thereon;
   (b) an electronic component having a top surface, a bottom surface generally parallel to said top surface, and at least one perimeter outer surface generally orthogonal to and between said top and bottom surfaces, said component comprising:
      an integrated circuit die;
      at least one termination wirebonded to a top surface of said die and extending outward therefrom;
      a heat spreader situated generally beneath and in thermal contact with said die; and
      an electrically insulative body portion enclosing at least a top surface of said die and a part of each termination proximate said die;
      wherein said heat spreader defines at least part of the bottom surface of said electronic component and at least part of the at least one perimeter outer surface of said electronic component;
      said electronic component being situated atop said solder pad such that said heat spreader is in thermal contact with said solder pad; and
   (c) a solder joint connecting said heat spreader to said solder pad.

9. An electronic assembly according to claim 8, wherein said solder pad has a top surface area larger than a bottom surface area of said heat spreader, and wherein said solder pad extends outward beyond at least one bottom edge of said component.

10. An electronic assembly according to claim 9, wherein said component is substantially rectangular in shape, and wherein a solder mask is placed on said solder pad adjacent and substantially parallel to bottom lateral edges of said component, wherein each solder mask runs across the entire length or width of said solder pad.

11. An electronic assembly according to claim 9, wherein said component is substantially rectangular in shape, and wherein a solder mask is placed on said solder pad adjacent to each non-termination-presenting bottom edge.

12. An electronic assembly according to claim 8, wherein at least an outer surface of said heat spreader is black.

13. An electronic assembly according to claim 8, wherein said heat spreader further defines at least part of the top surface of said electronic component.

14. An electronic assembly according to claim 8, wherein said heat spreader is composed of copper or aluminum.

* * * * *